United States Patent
Ferreira Villares et al.

(10) Patent No.: US 10,554,018 B2
(45) Date of Patent: Feb. 4, 2020

(54) HYBRID VERTICAL CURRENT INJECTION ELECTRO-OPTICAL DEVICE WITH REFRACTIVE-INDEX-MATCHED CURRENT BLOCKING LAYER

(71) Applicant: INTERNATIONAL BUSINESS MACHINES CORPORATION, Armonk, NY (US)

(72) Inventors: Gustavo Ferreira Villares, Zurich (CH); Herwig Hahn, Adliswil (CH); Marc Seifried, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 15/846,238

(22) Filed: Dec. 19, 2017

(65) Prior Publication Data

US 2019/0190235 A1    Jun. 20, 2019

(51) Int. Cl.
*H01S 5/22* (2006.01)
*H01S 5/026* (2006.01)
(Continued)

(52) U.S. Cl.
CPC .............. *H01S 5/2218* (2013.01); *G02B 6/42* (2013.01); *H01S 5/021* (2013.01); *H01S 5/026* (2013.01);
(Continued)

(58) Field of Classification Search
CPC ........ H01S 5/222; H01S 5/021; H01S 5/0215; H01S 5/2205–2226; H01S 5/2214
See application file for complete search history.

(56) References Cited

U.S. PATENT DOCUMENTS 4,230,997 A * 10/1980 Hartman ................. H01S 5/227
257/51
5,212,701 A * 5/1993 Choquette ........... H01S 5/18308
372/45.01
(Continued)

FOREIGN PATENT DOCUMENTS

JP     2010245378 A    10/2010
JP     2014154798 A     8/2014

OTHER PUBLICATIONS

Wang et al., "High power asymmetric 980nm broad-waveguide diode lasers with current blocking layer," 2012 International Conference on Optoelectronics and Microelectronics (ICOM), Aug. 23-25, 2012, Copyright 2012 IEEE, pp. 123-127.

*Primary Examiner* — Xinning(Tom) Niu
*Assistant Examiner* — Sean P Hagan
(74) *Attorney, Agent, or Firm* — Jordan T. Schiller (57) ABSTRACT

The invention is directed to a hybrid, vertical current injection electro-optical device, comprising an active region and one or more current blocking layers. The active region includes a stack of III-V semiconductor gain materials designed for optical amplification. The gain materials of the stack are stacked along a stacking direction z, which is perpendicular to a main plane of the stack. The one or more current blocking layers extend perpendicularly to the stacking direction z and laterally on opposite sides of the active region. The one or more current blocking layers each have an effective refractive index $n_1$ that is matched to the effective refractive index n of the active region, i.e., $n_1 = f \times n$, with $f \in [0.95; 1.05]$. The invention is further directed to a silicon photonics chip comprising such an electro-optical device.

20 Claims, 9 Drawing Sheets

(51) Int. Cl.
 H01S 5/343 (2006.01)
 H01S 5/02 (2006.01)
 H01S 5/10 (2006.01)
 G02B 6/42 (2006.01)

(52) U.S. Cl.
 CPC ......... *H01S 5/0215* (2013.01); *H01S 5/1032* (2013.01); *H01S 5/2214* (2013.01); *H01S 5/34313* (2013.01)

(56) References Cited

U.S. PATENT DOCUMENTS

| | | |
|---|---|---|
| 6,256,330 B1 | 7/2001 | LaComb |
| 6,878,959 B2 | 4/2005 | Bour et al. |
| 8,437,375 B2 | 5/2013 | Fujimoto et al. |
| 2003/0185262 A1* | 10/2003 | O'Gorman ............. H01S 5/223 372/45.01 |
| 2006/0165143 A1* | 7/2006 | Ohno .................... B82Y 20/00 372/46.015 |
| 2008/0002929 A1* | 1/2008 | Bowers ................ H01S 5/0424 385/15 |
| 2009/0059986 A1 | 3/2009 | Tachibana et al. |
| 2010/0260225 A1 | 10/2010 | Takagi |
| 2011/0284896 A1 | 11/2011 | Park |
| 2012/0069862 A1* | 3/2012 | Ohira ................... H01S 5/0425 372/45.01 |
| 2012/0211788 A1 | 8/2012 | Yuh et al. |

\* cited by examiner

HYBRID VERTICAL CURRENT INJECTION ELECTRO-OPTICAL DEVICE WITH REFRACTIVE-INDEX-MATCHED CURRENT BLOCKING LAYER

BACKGROUND

The present invention relates in general to hybrid, vertical current injection electro-optical devices and silicon photonics chips that include such electro-optical devices. In particular, the present invention is directed to a hybrid, vertical current injection electro-optical device comprising a current blocking layer, whose refractive index is matched to the effective refractive index of the optical amplification region of the device.

The integration of III-V semiconductor gain materials (e.g., for light sources emitting at datacom and/or telecom wavelengths) in silicon photonics platforms is desired, for example to obtain high-bandwidth optical interconnects. The monolithic integration of III-V optoelectronic devices on silicon (Si), complementary metal oxide semiconductor (CMOS) platforms require shallow stacks of III-V semiconductor gain materials designed for optical amplification, e.g., forming a multiple quantum well, or MQW. The optical modes involved in such structures are typically hybrid modes, i.e., modes that are partially located in the III-V region and partially in the Si waveguide core underneath. The higher the overlap of the mode with the III-V active region, the easier it is to achieve a lasting effect.

In recent years, substantial efforts have been made to achieve satisfactory integration of small electro-optical devices in III-V-based silicon photonics platforms, in order to achieve low-power, on-chip optical interconnects.

SUMMARY

According to a first aspect, the present invention is embodied as a hybrid, vertical current injection electro-optical device such as an edge-emitting, vertical current injection laser. The device comprises an active region and one or more current blocking layers (CBLs). The active region includes a stack of III-V semiconductor gain materials designed for optical amplification. The stack of III-V semiconductor gain materials may for example comprise $In_{1-x-y}Al_xGa_yAs$, with $0 \leq x \leq 1$ and $0 \leq y \leq 1-x$, InGaAsP or InGaAsN.

The gain materials of the stack are stacked along a stacking direction z, which is perpendicular to a main plane of the stack. The one or more CBLs extend perpendicularly to the stacking direction z and laterally on opposite sides of the active region.

Remarkably, the one or more CBLs each have an effective refractive index $n_1$ that is essentially matched to the effective refractive index n of the active region, i.e., $n_1 = f \times n$, with $f \in [0.95; 1.05]$. The two indices should be as close as possible, such that the factor f is preferably between 0.98 and 1.02 (i.e., $f \in [0.98; 1.02]$) or, even, between 0.99 and 1.01 (i.e., $f \in [0.99; 1.01]$). As explained later in detail, such a design allows for less mode competition and, eventually, makes it possible to improve the pumping of the fundamental mode.

Preferably, the average width w of the one or more CBLs is between 1 μm and 7 μm. This average width w is measured in the main plane of the stack, in a radial direction y that extends radially from a center of the active region.

In preferred embodiments, the average width w is substantially equal to, or within a threshold value of, an average diameter d of the active region, wherein the average width w and the diameter d are, each, measured along said radial direction y in said main plane.

Preferably, an average thickness t of the one or more CBLs, as measured parallel to said stacking direction z, is essentially equal to, or within a threshold tolerance of, an average thickness t of the active region. This average thickness t may for instance be between 100 nm and 500 nm.

In preferred embodiments, one or more additional CBLs (hereinafter second CBLs) are provided, in addition to the first CBLs, i.e., the index-matched CBLs. The second CBLs extend perpendicularly to the stacking direction z and laterally on opposite sides of the structure formed by the first CBLs and the active region. The second CBLs have, each, an effective refractive index $n_2$, which is smaller than each of the refractive index n of the active region and the refractive index $n_1$ of the first CBL. Namely, $n_2 = f_2 \times \text{Min}[n, n_1]$, with $f_2 < 0.99$ or, preferably, $f_2 < 0.90$. The second CBLs 122 cause to block vertical, transversal electron flow paths. All the more, the second CBLs make it possible to prevent or mitigate exceedingly large optical absorptions that could else be caused by the ohmic contacts. As a result, ohmic contacts can preferably be arranged vis-à-vis with portions of the second CBLs, i.e., opposite to portions of the one or more second current blocking layers, with respect to a contact layer covering each of: the one or more first current blocking layers; the one or more second current blocking layers; and the active region.

In embodiments, an average width w of the second CBLs is substantially equal to, or within a threshold value of, each of the average width w of the first CBLs and the average diameter d of the active region. In other words, a 1:1:1 ratio is preferably sought, which makes it possible to improve the optical modes confinement. Said width w and diameter d are, each, measured along a same direction y in the main plane of the stack.

Preferably, the average thickness t of the second CBLs is essentially equal to, or within a threshold tolerance of, each of: (i) the average thickness of the first CBLs; and (ii) the average thickness of the active region. This thickness is measured parallel to the stacking direction z.

According to another aspect, the invention is embodied as a silicon photonics chip, which comprises an electro-optical device (according to embodiments) integrated therein. For example, this electro-optical device comprises an active region with a stack of III-V semiconductor gain materials and one or more CBLs, whose effective refractive index $n_1$ is essentially matched to that of the active region, consistently with embodiments described above.

Preferably, the silicon photonics chip comprises a first wafer component and a second wafer component. The first wafer component is a silicon on insulator wafer processed so as to exhibit: a silicon substrate; a buried oxide layer on top of the silicon substrate; and a silicon component structured from an initial top silicon layer of the silicon on insulator wafer, where the silicon component is embedded in a cladding layer. The second wafer component comprises the active region, as well as the one or more CBLs. The second wafer component is bonded to the first wafer component, so as for the stack of III-V semiconductor gain materials to be opposite the silicon component, with the cladding layer extending between said stack and said silicon component, such that optical radiation out-coupled from the stack may couple into the silicon component, in operation.

Shallow stacks are preferred; the average thickness of the stack of III-V semiconductor gain materials may for instance be between 50 nm and 500 nm, as measured parallel to the stacking direction z.

In preferred embodiments, the electro-optical device is a CMOS-fabricated device, whose stack of III-V semiconductor gain materials is embedded in the back end of the line of the silicon photonics chip. Preferably, the electro-optical device is co-integrated, in the back end of the line of the silicon photonics chip, with one or more CMOS-fabricated integrated circuits, which may for example comprise transistors configured for driving said electro-optical device.

Devices embodying the present invention will now be described, by way of non-limiting examples, and in reference to the accompanying drawings.

BRIEF DESCRIPTION OF SEVERAL VIEWS OF THE DRAWINGS

In FIGS. 1A and 1B, the electro-optical device comprises an active region (of gain materials) located between strips of current blocking layers, whose effective refractive is matched to that of the active region. In FIGS. 2A-2D, the device further comprises additional, outer current blocking layers of lower refractive index;

The accompanying drawings show simplified representations of devices or parts thereof, as involved in embodiments. Technical features depicted in the drawings are not necessarily to scale. Similar, or functionally similar, elements in the figures have been allocated the same numeral references, unless otherwise indicated.

DETAILED DESCRIPTION

As noted in the background section above, shallow stacks of III-V semiconductor gain materials are desired for monolithic integration of III-V optoelectronic devices on silicon (Si), complementary metal oxide semiconductor (CMOS) platforms. The thickness of such stacks should typically be less than 500 nm. The optical modes involved in such structures are typically hybrid modes, i.e., modes that are partially located in the III-V region and partially in the Si waveguide core underneath. The higher the overlap of the mode with the III-V active region, the easier it is to achieve a lasting effect.

Still, in such a configuration, a simple top electrode covering the whole III-V region is not an option. Indeed, a too large optical absorption by the metal electrode on top would likely prevent the lasing action. Hence, the top electrode has to be spatially separated from the optical mode. For edge-emitting lasers (or similar lasers for hybrid configurations, e.g., distributed Bragg reflector (DBR) laser, or distributed feedback (DFB) laser, in which mirrors are provided in the Si waveguide core underneath), this eventually leads to a configuration in which two top electrodes and two bottom electrodes are symmetrically positioned. In such structures, the current and the optical mode can be confined thanks to a current blocking layer (CBL). To achieve a lasing action, the current must hence pass through the active region rather than through the CBL region or its surface area.

Conventional hybrid, vertical current injection structures are known, which include lateral CBLs. Such structures can for instance be obtained by: (i) regrowth of an i-InP layer or a thyristor; (ii) wet oxidation; or (iii) a selective quaternary wet etch, which all make it possible to achieve a suitable refractive index contrast. However, because of the high series resistances that are faced in thin hybrid III-V structures, the current will flow mainly next to the CBL and it will drop towards the center of the structure (i.e., the center along the horizontal direction). Now, and as present inventors have realized, this may typically result in a less efficient pumping of the fundamental mode (it being noted that the highest intensity of the fundamental mode is spatially separated from areas of highest electron-hole recombinations) and, additionally, in pumping of higher-order transverse modes. As a consequence, the lasing power will eventually be distributed among competing transverse modes, leading to lower output power of the fundamental mode. More precisely, in such conventional structures, the mode profile cannot be engineered independently from the current flow as the fundamental mode happens to be mainly pumped at regions with lower intensity, while the $1^{st}$ and $2^{nd}$ higher-order modes are mainly pumped at regions with higher intensity.

Now, and as present inventors have further realized, modal gain in higher transverse order modes can be circumvented thanks to a current blocking layer, whose refractive index is matched to that of the active region. This refractive-index-matched CBL (or RIM-CBL) shall preferably be located next to a common current blocking layer (of lower refractive index). Solutions, as developed by the inventors, eventually allow the center of the fundamental mode to be pumped, without substantially pumping the odd, higher-order modes ($1^{st}$, $3^{rd}$ etc.), while allowing reduced pumping of the even, higher-order modes ($2^{nd}$, $4^{th}$, etc.). A detailed description follows.

Figure 5:
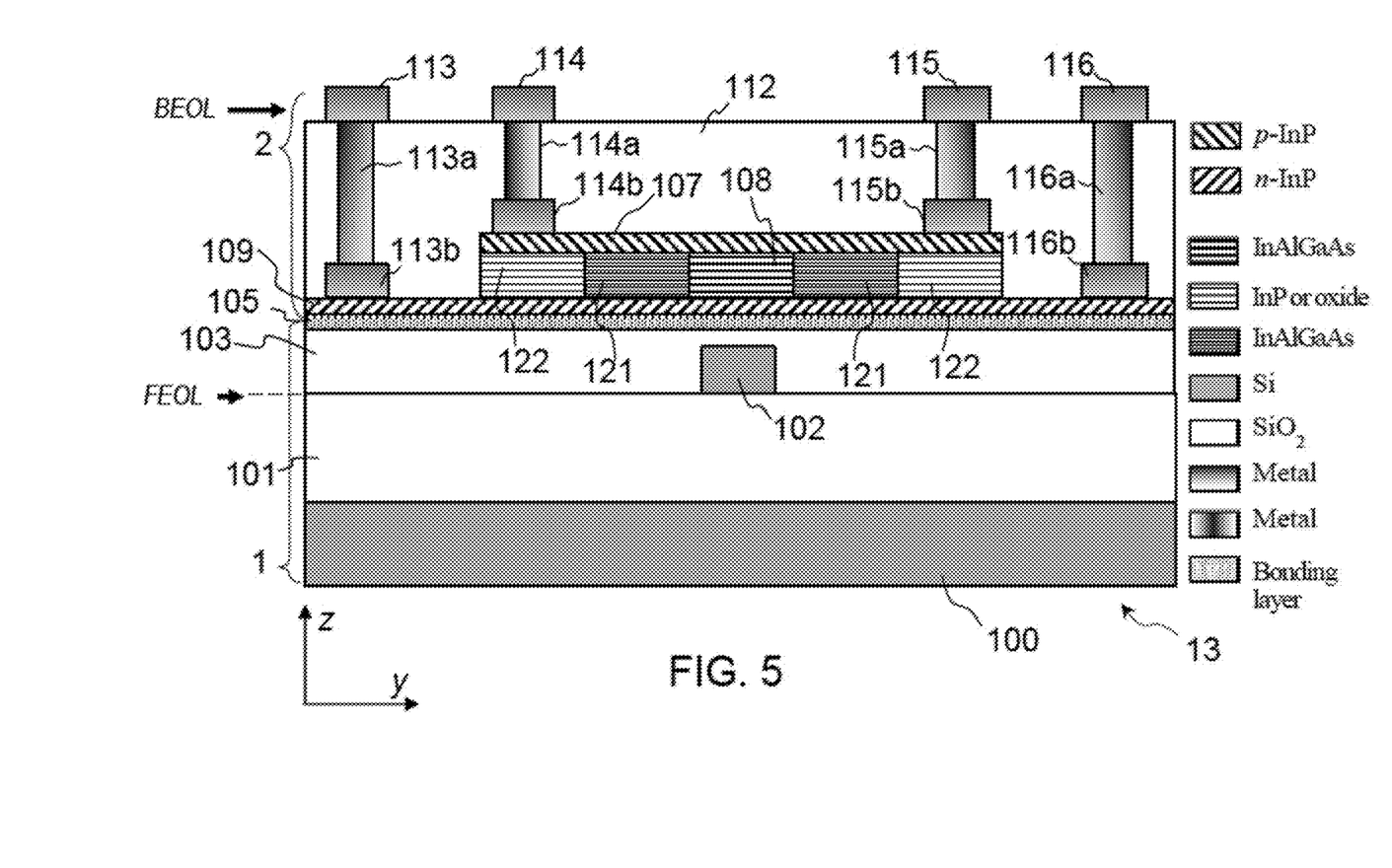
FIG. 5 is a 2D cross-sectional view of a silicon photonics chip, comprising an electro-optical device (e.g. as depicted in FIGS. 2A-2D) integrated therein, in accordance with embodiments of the present invention.
Figure 6:
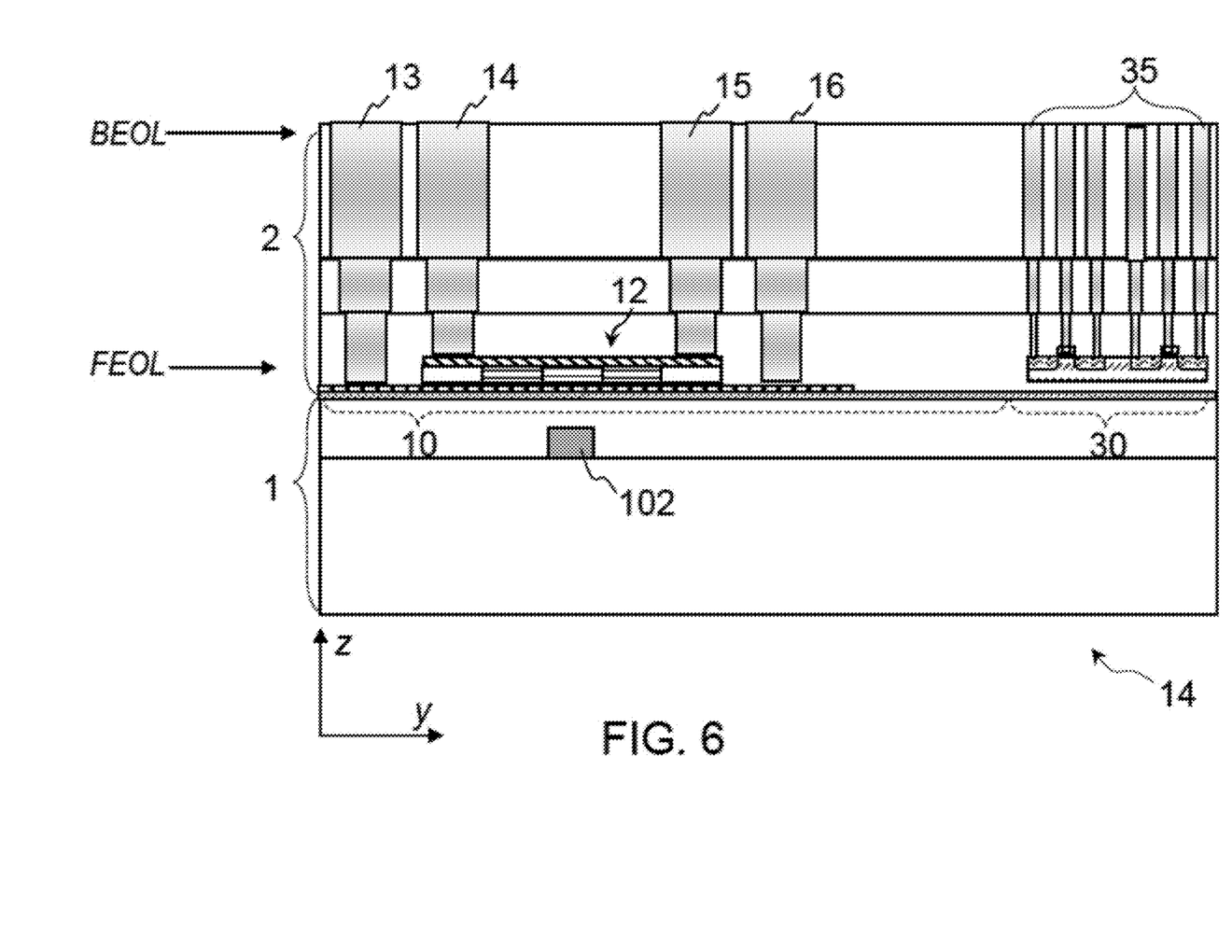
FIG. 6 is a 2D cross-sectional view of another silicon photonics chip, comprising additional components, wherein the electro-optical device is co-integrated, in the back end of the line of the photonics chip, with CMOS-fabricated integrated circuits, in accordance with embodiments of the present invention.

A first aspect of the invention concerns hybrid, vertical current injection (VCI) electro-optical devices 11, 12, 12a. Examples of such devices are depicted in FIGS. 1-4. Another aspect of the invention concerns a Si photonics chip 13, 14, which comprises a hybrid, VCI device and, possibly other devices co-integrated therewith. Examples of Si photonics chips 13, 14 are depicted in FIGS. 5 and 6. Now, the electro-optical devices such as depicted in FIGS. 1-4 are likely to form part of a Si photonics chip. Conversely, a Si photonics chip can also be regarded as an electro-optical device.

Essentially, a hybrid, vertical current injection device 11-14, according to embodiments, comprise an active region 108 and one or more CBLs 121.

The active region 108 comprises a stack of optically active, III-V semiconductor gain materials, often referred to as a "III-V stack" (or even "stack") in the following. This stack involves materials from the group of III-V compound semiconductors that provide the gain medium, so as to achieve optical amplification of radiations of interest, as known per se. The III-V materials of the stack 108 are stacked along the stacking direction z, which is perpendicular to a main plane of the stack 108. The main plane of the stack is parallel to the plane (x, y) in the accompanying drawings.

The one or more CBLs 121 each extend perpendicularly to the stacking direction z. They further extend, each, laterally (in-plane) and on opposite sides of the active region 108. That is, the lateral CBLs 121 generally extend in a same plane as the active region 108.

Consistently with the usual definition of a CBL, the present CBLs 121 are designed to block charge carriers (i.e., electrons and holes). Thus, the CBLs 121 notably prevent charge carriers from flowing transversally to (i.e., vertically through) the CBLs 121. Instead, charge carriers must get around the CBLs, as illustrated by dotted arrows in FIGS. 1B, 2B-2D, in order to travel vertically (along z), it being reminded that the devices 11-14 are vertical current injection devices.

One or more CBL portions 121 may be involved. Preferably, several CBL portions are involved, which are arranged on opposite sides of the active region 108. For example, two layer portions 121 may respectively be arranged on two opposite, outer (lateral) sides of the active region 108.

Figure 3:
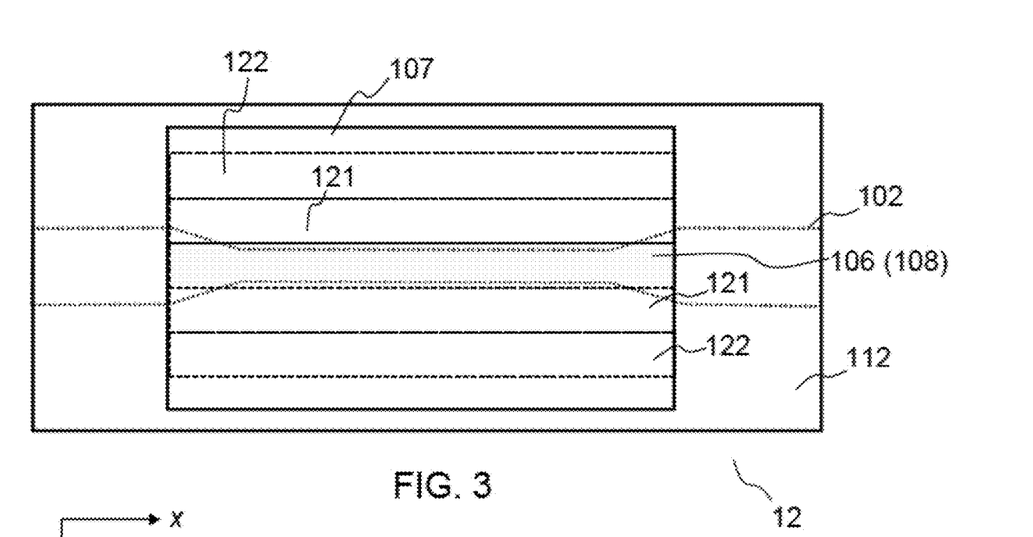
FIG. 3 shows a top view of a device, as depicted in FIGS. 2A-2D, in accordance with embodiments of the present invention.

The lateral CBLs may for instance be shaped as strips 121, each extending alongside the active region 108, as illustrated in FIG. 3. For example, the CBLs 121 appear, each, as a strip also from the top in that case, as seen in FIG. 3. As further seen in FIG. 3, the active region 108 is nested (laterally, in-plane) within the CBLs 121, or CBL portions, which adjoin the active region 108 on outer sides thereof. Other possible configurations are later discussed in reference to FIG. 4.

Note that a "layer" as used herein denotes a layer, or a portion of layer, which may be structured, so as to form, e.g., a strip, a ring or a portion of a ring, and which is not necessarily planar, unless otherwise indicated. This, notably, applies to CBLs as described herein.

The effective refractive index (noted $n_1$) of the CBLs 121 is matched to the effective refractive index (noted n) of the active region 108, subject to a factor f that is in the range 0.95-1.05. That is, each of the CBLs 121 has an effective refractive index $n_1$, where $n_1 = f \times n$, with $f \in [0.95; 1.05]$. In other words, the absolute value of the relative difference between the indices n and $n_1$ is less than 5% and, preferably, less than 2%. Such a difference may even be less than 1%. Ideally, the effective indices n and $n_1$ should be as close to each other as possible. Yet, in practice, small deviations may be observed due to the materials used and their geometry. Still, the effective refractive index of the CBLs 121 is essentially matched to that of the active area 108. The CBLs 121 are therefore referred to as refractive index-matched CBLs in the following, or RIM-CBLs for short.

As a result, optical modes can now get confined within the structure 106-108-121 formed by the active region and the adjoining RIM-CBLs 121. Such a design makes it possible to achieve devices that allow less mode competition, whereby a reduced pumping of higher order modes and an improved pumping of the fundamental mode are eventually achieved. In other words, a RIM-CBL as proposed herein allows a recombination zone to be defined (i.e., where electrons and holes are injected) independently from the mode confinement. Thus, the present approach allows an additional degree of freedom in the designing of the electro-optical devices 11-14.

In detail, electro-optical devices 11-14, as disclosed herein, allow the pumping of odd higher-order modes to be largely mitigated, if not prevented, thanks to the presence of the RIM-CBL(s) 121. In addition, such devices result in a less efficient pumping of even, higher-order modes. On the other hand, the RIM-CBL(s) 121 may, together with the aperture defined by the III-V stack 108, be designed to minimize the overlap of the recombination zone and the modal intensity for higher-order modes. For example, the pumping of the fundamental mode can be improved as the high intensity area has a better overlap with the recombination zone.

However, when implemented in a thin stack, as preferably contemplated herein, a sole RIM-CBL(s) 121 may, in absence of additional CBLs 122, also lead to additional absorption caused by the proximity of the optical modes with the ohmic contacts. Thus, to mitigate this potential issue, additional CBLs 122 (e.g., comprising an oxide or InP) may additionally be used, in addition to the RIM-CBL(s) 121. Using such additional CBLs makes it possible to separate all optical modes from the ohmic contacts along the y-direction. This, in turn, prevents the absorption of all the optical modes and thus makes it possible to preserve benefits of the RIM-CBL(s) 121, even when used in thin stacks of optoelectronic devices.

For example, when applied to laser devices, the present approach allows two main effects to be achieved. First, the threshold current of the laser (to obtain lasing for the fundamental mode) can be decreased. Second, the output power on the fundamental mode can be increased. Namely, the threshold of the higher-order modes is shifted to higher injection currents. This, in turn, results in a larger share of output power of the fundamental mode with respect to the total output power.

All the novel devices disclosed herein assume a vertical current injection scheme. The present approach would indeed not be useful for lateral injection devices, as the RIM-CBL would just lead to additional losses and hence not provide the same benefits as in a vertical injection scheme. The present electro-optical devices may notably be configured as an edge-emitting, vertical current injection laser. More generally though, such devices may also be configured as a semiconductor optical amplifier (SOA). Thus, in general, the III-V stack 108 may be regarded as a stack of materials capable of amplifying radiation in a given range of wavelengths.

The wavelength range of interest is in the optical range (i.e., in the wavelength range between 100 nm and 1 mm), according to DIN 5031. However, the wavelength range will, in most applications as contemplated herein, be between 200 nm and 7.5 μm. In particular, wavelengths of 1.3 and 1.55 μm are typically contemplated (and possibly 980 nm), for datacom and telecom applications.

In that respect, the present electro-optical devices may for instance be integrated on a silicon-on-insulator (SOI) platform, for Si photonics applications. Amongst other applications, ultra-dense monolithic integration of lasers on chips for core-to-core communication is contemplated. Integrated lasers and optical amplifiers, as obtained in embodiments, may further be used in non-von-Neumann computing concepts, such as optical reservoir computing. In addition, laser devices as contemplated herein may be used as optical light sources in hardware-based neuromorphic architectures. Finally, integration of light sources and/or SOAs together with CMOS sensors may notably be contemplated for Internet of things (IoTs) applications.

Figure 1A:
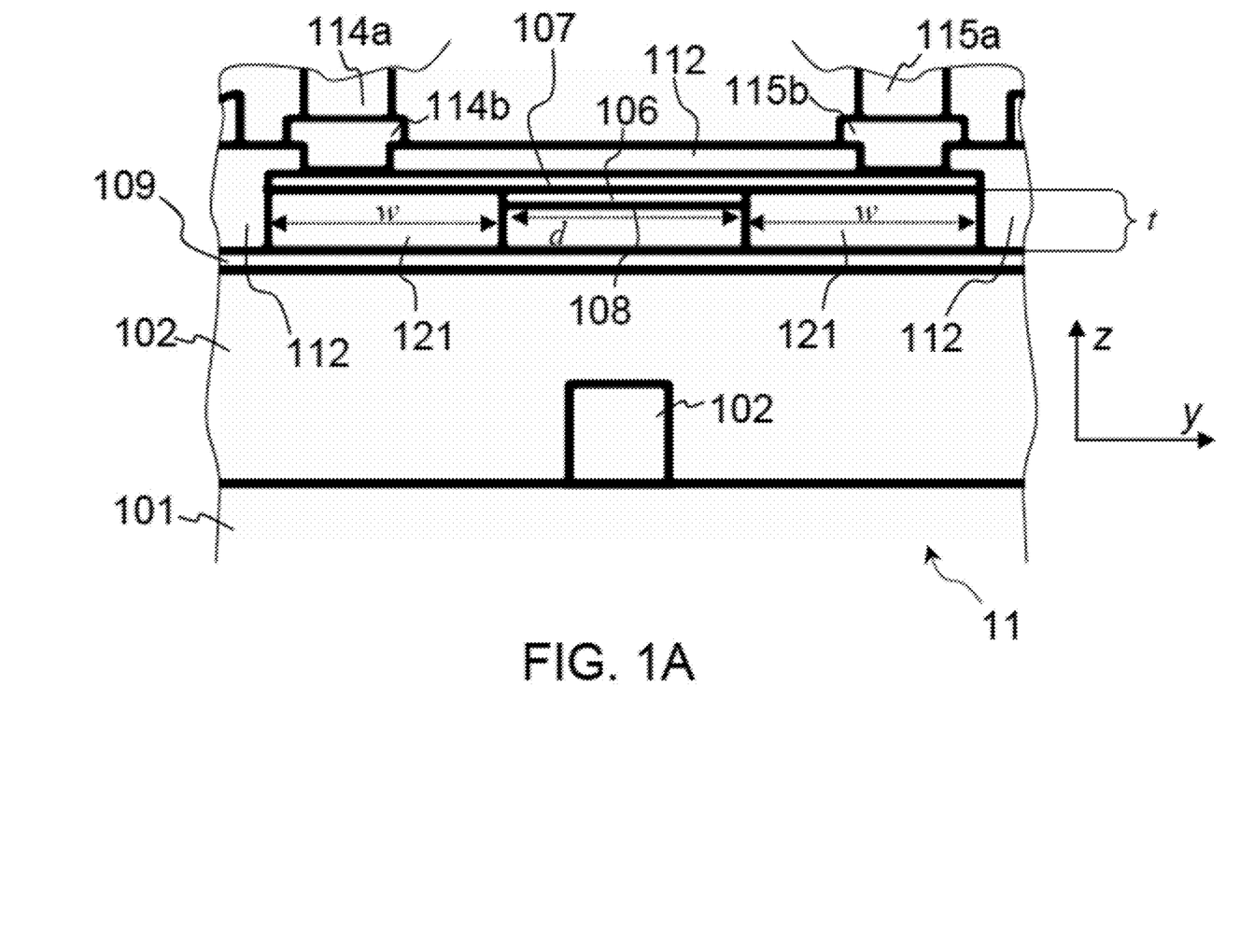
FIGS. 1A, 1B and 2A-2D each show 2D cross-sectional views of electro-optical devices, in accordance with embodiments of the present invention.
Figure 1B:
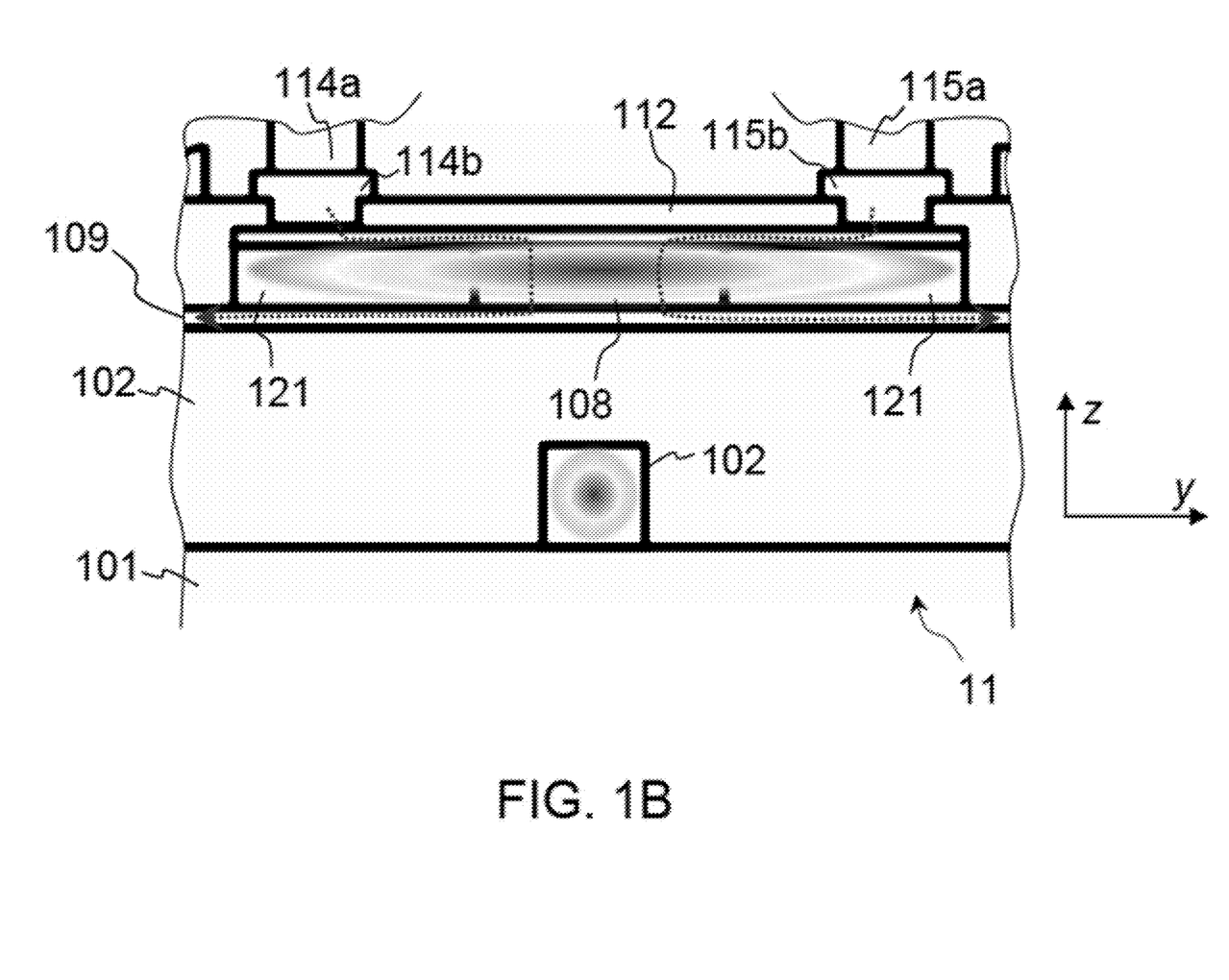

In terms of dimensions, electro-optical devices, such as those depicted in FIGS. 1-3, shall preferably be designed so as to be compact and have a small footprint in order to ease integration thereof. Yet, the lateral dimensions of such devices should be devised consistently with dimensions of optical modes meant to be amplified and confined therein. In that respect, the average width w of the lateral RIM-CBL portions 121 may typically be between 1 µm and 7 µm. Note that all intervals mentioned herein are closed intervals, including endpoints (i.e., w ∈ [1 µm, 7 µm]). The width w is measured in the main plane of the stack, in a radial direction y that extends radially from a center of the active region 108, as better seen in FIGS. 1A and 2A. That is, the width is measured radially from the center of the active region 108, along a given cross-sectional direction y, which is perpendicular to the stacking direction z, and in the main plane of the active region 108. For example, the outer, average length (along y) of the geometrical structure spanned by the RIM-CBLs 121 exceeds the average diameter d of the active region 108 by at least 2 µm and by less than 14 µm.

Figure 2A:
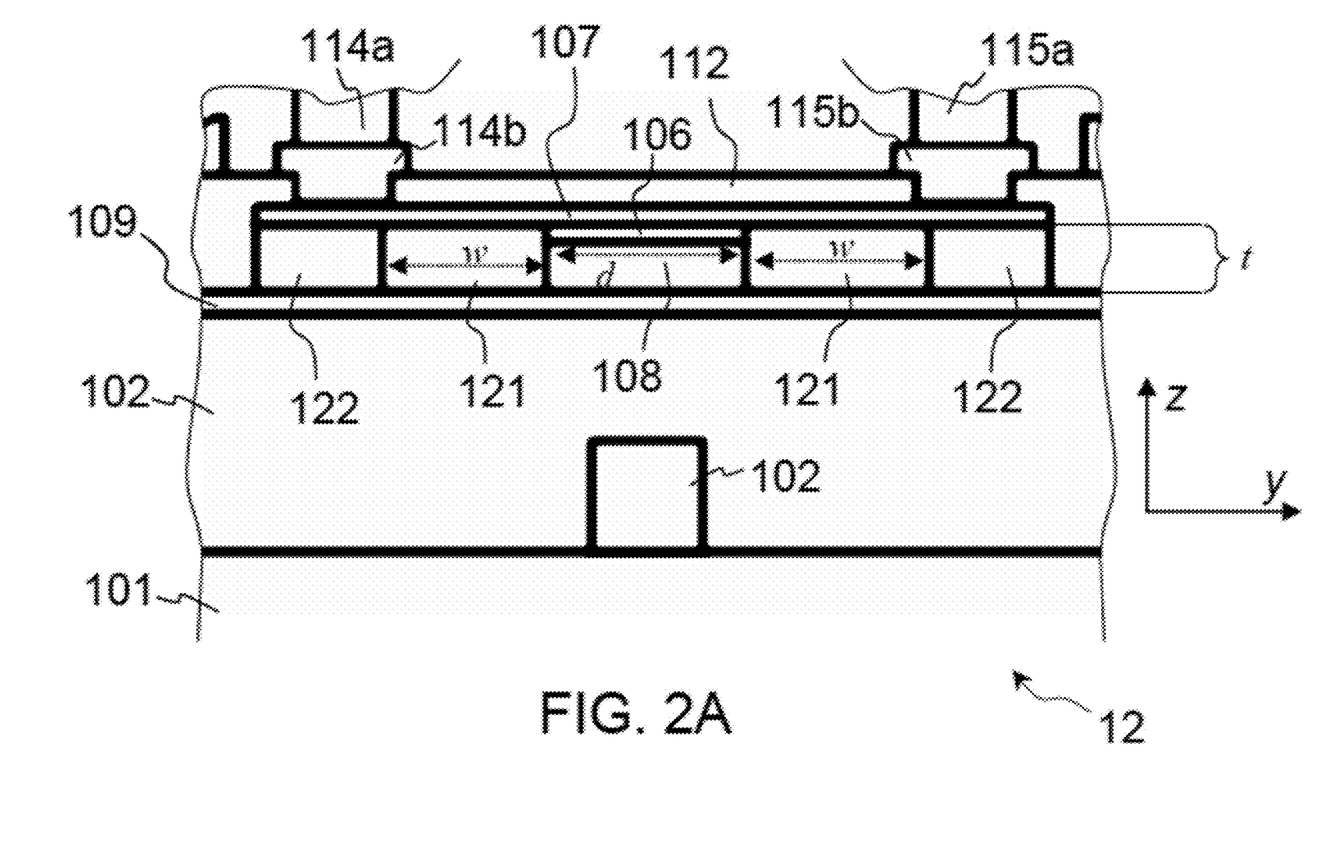
Figure 2B:
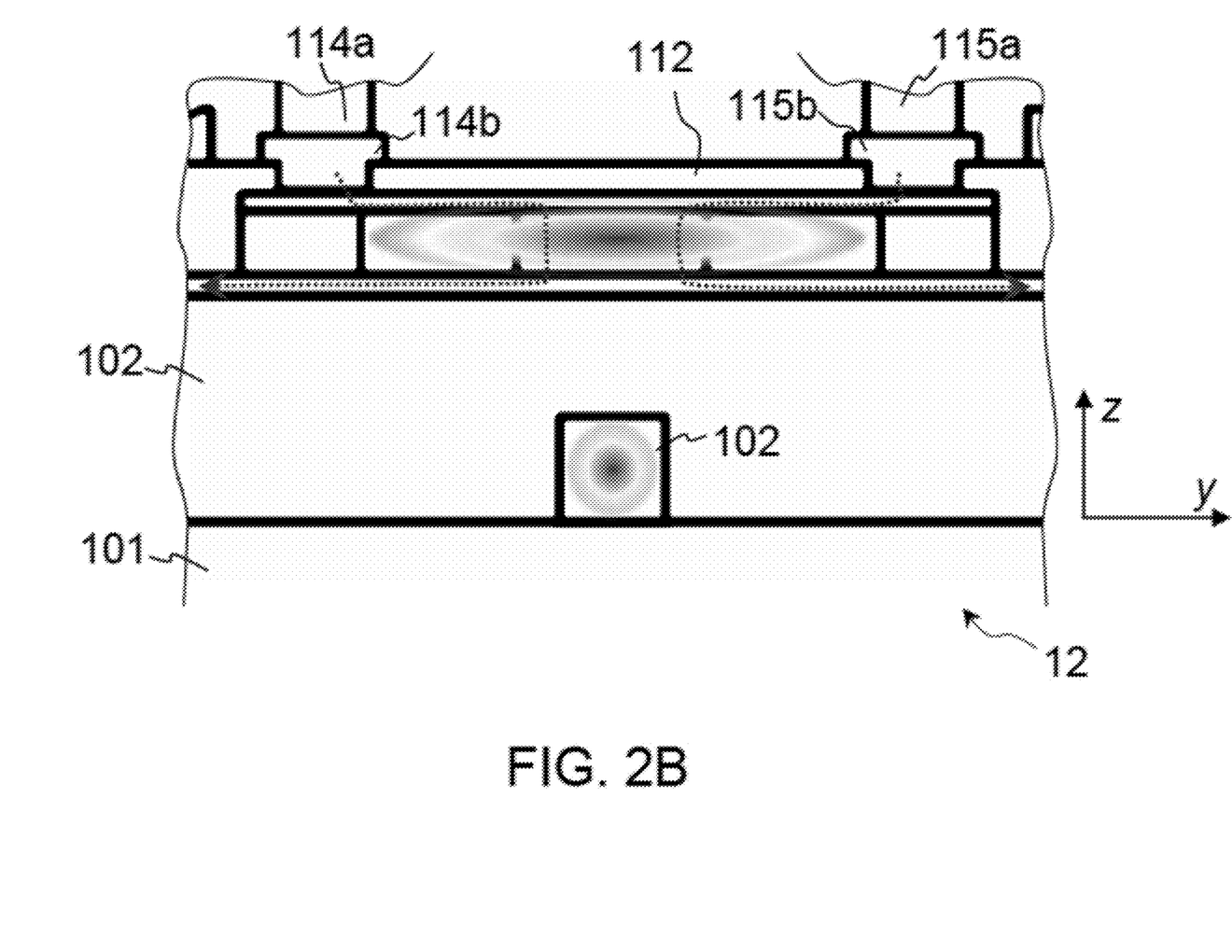
Figure 2C:
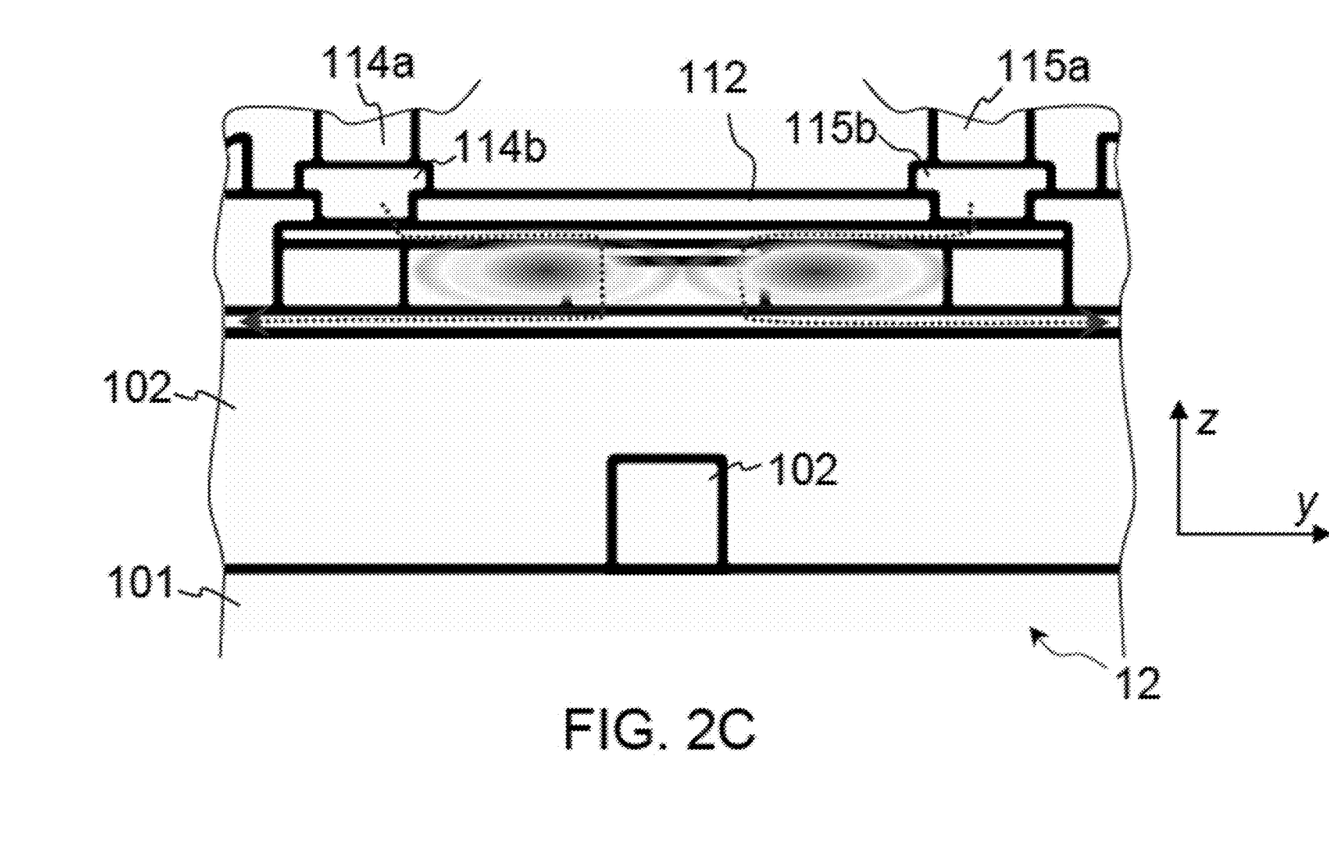
Figure 2D:
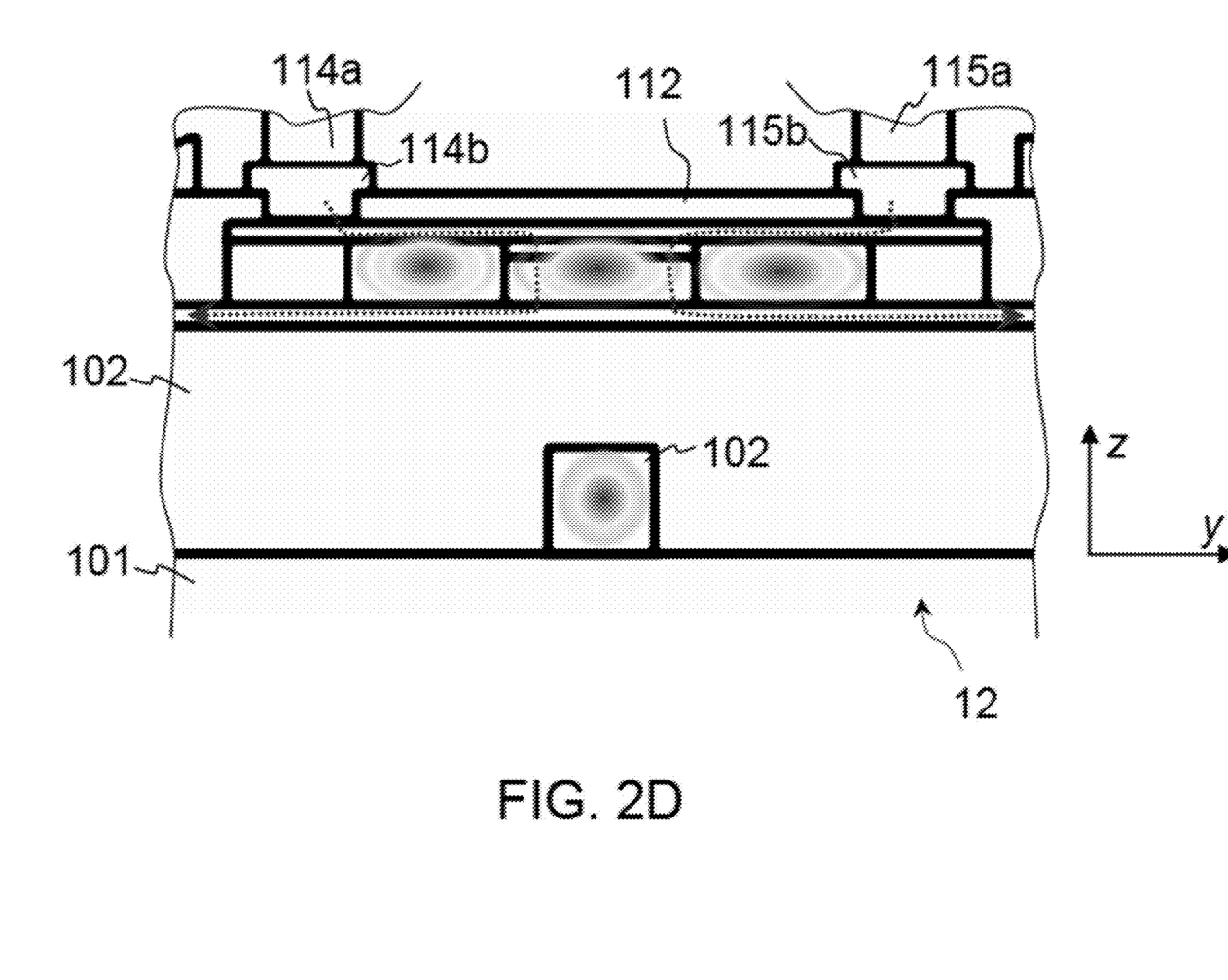

More preferably, the average width w of the lateral RIM-CBL portions 121 is substantially equal to, or within a threshold value of, the average diameter d of the active region 108, see FIG. 1A, 2A. The width w and the diameter d are, each, measured along the radial direction y, in the main plane of the active region. This aspect is discussed below in detail.

Figure 4:
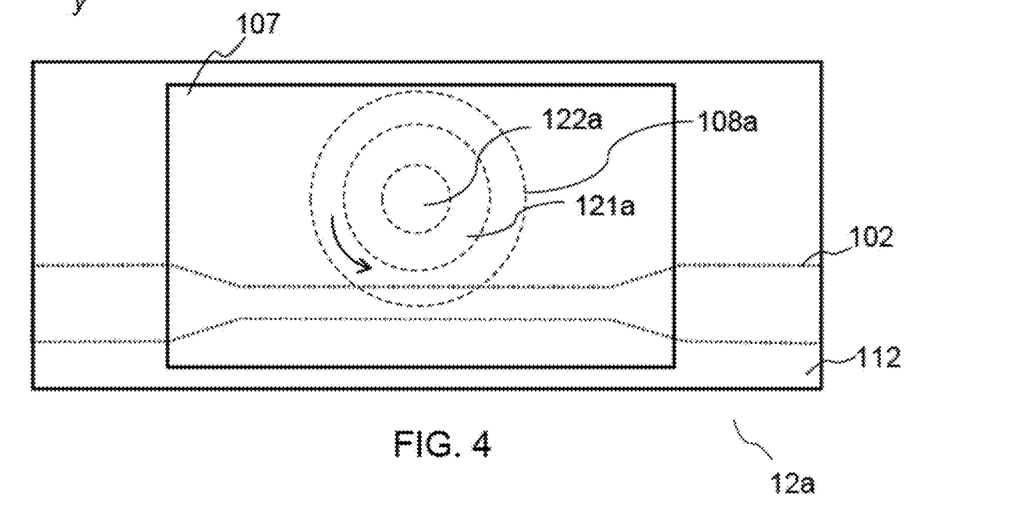
FIG. 4 is a top view of a variant to FIG. 2, wherein the active region and the current blocking layers form a microdisk structure, in which the current blocking layers are nested (in-plane) within a ring-shaped active region, in accordance with an embodiment of the present invention.

Contrary to embodiments illustrated in FIGS. 2-4, the device of FIG. 1 does not include an additional CBL 122 of lower refractive index. That is, in FIG. 1, the RIM-CBLs 121 are nested, laterally, within an outer cladding layer 112, rather than within additional CBLs 122 (as in FIG. 2, 3 or 5, 6). Now, a potential issue that may occur with a configuration as shown in FIG. 1 is that optical modes may possibly extend beyond the active region 108, and through the RIM-CBL 121, as schematically depicted in FIG. 1B, thanks to a density plot of the mode intensity. In such a case, the optical modes get confined, laterally, between the outer, lateral cladding portions 112 (which have a lower refractive index). However, as present inventors have further realized, this may result in an exceedingly large optical absorption caused by the ohmic contacts 114b, 115b, as the latter would typically be located opposite to outer portions of the RIM-CBL 121.

Therefore, the present electro-optical devices 12, 13 and 14 may advantageously include additional CBLs 122, as shown in the embodiments of FIGS. 2, 5 and 6. Namely, the device 12-14 may comprise one or more second CBLs 122, which extend perpendicularly to the stacking direction z and laterally on opposite sides of the structure 106-108-121. Like the first CBLs 121 (i.e., the RIM-CBL), the second CBLs may be etched, oxidized or regrown. However, the second CBLs 122 each have an effective refractive index $n_2$, which is smaller than each of the refractive index n of the active region and the refractive index $n_1$ of the first current blocking layer. This can be noted $n_2 = f_2 \times \text{Min}[n, n_1]$, where $f_2$ is strictly less than 1 (and positive, by definition).

For example, the second CBLs 122 have an effective refractive index $n_2$ that is lower than that of the active region 108 and that of the first RIM-CBL 121. The refractive index differences should typically be larger than 0.01 (i.e., $f_2 < 0.99$) and, more preferably, larger than 0.1 ($f_2 < 0.90$), to ensure a sufficient refractive index contrast. Of course, larger refractive index differences can be contemplated. For example, the RIM-CBL 121 may comprise InP, so as for its index $n_1$ to be approximately equal to 3.2, and the active region 108 may have a refractive index n that is roughly equal to 3.4. Now, the second CBLs may, for example, comprise oxides (e.g., $Al_2O_3$ and $SiO_2$) such that large differences of refractive indices may be obtained.

Thus, the effective refractive index of the second CBLs 122 allows optical modes to be now efficiently confined within the structure 106-108-121, i.e., the structure formed by the active region and the adjoining RIM-CBLs 121, where the latter is nested, in-plane, within the second CBLs 122. Meanwhile, the second CBLs 122 block electrons. They notably prevent electrons from flowing transversally to (vertically through) the layer portions 122. Instead, electrons must get around the CBLs 121, 122, as illustrated by dotted arrows in FIGS. 2B-2D, in order to travel vertically (along z).

A structure as depicted in FIGS. 2-3, which includes additional CBLs 122, makes it possible to mitigate the optical absorption caused by the ohmic contacts 114b, 115b. Thus, the ohmic contacts 114b, 115b may now advantageously be located vis-à-vis with outer, lateral portions of the second CBLs 122, without causing exceedingly large optical absorption. That is, the ohmic contacts 114b, 115b can be arranged opposite to portions of the additional CBLs 122. In particular, and as illustrated in FIG. 2 or 5, the ohmic contacts 114b, 115b can be arranged opposite to portions of the CBLs 122, with respect to the contact layer 107, which covers (i.e., coats) each of the first and seconds CBLs 121, 122, and the active region 108. As a result, the first- and second-order modes (see FIGS. 2C, 2D) happen to be less efficiently pumped, such that a more efficient pumping of the fundamental mode can be achieved.

Next, one may want to achieve a 1:1:1 ratio between widths of the successive layer portions 108, 121, and 122, in order to optimize the optical modes confinement. Thus, in embodiments, the electro-optical devices 12-14 are designed such that the average width w of the second CBLs 122 is substantially equal to, or within a threshold value of, each of: (i) the average width w of the first CBLs 121; and (ii) the average diameter d of the active region 108. Again, the widths w and the diameter d are, each, measured along a same direction y. Still, this ratio 1:1:1 holds approximately in practice and is therefore subject to a tolerance. That is, the relative differences should be less than 20% or 10% (in absolute value).

Common features of the devices depicted in FIGS. 1-3 and 5, 6 are now described in detail. The devices depicted in FIGS. 1A-1B comprise a single lateral CBL portion 121 (i.e., a RIM-CBL portion, formed as a strip) on each side of the active region 108, extending along y. Like in FIGS. 2-3 and 5, the devices of FIGS. 1A-1B are configured as an edge-emitting, vertical current injection (VCI) laser device 11, 12. Since current injection is vertical, the contact layers 107, 109 extend parallel to the active region 108. That is, layers 107, 109 extend essentially parallel to the main plane of the stack 108, i.e., parallel to (x, y). The contact layers 107, 109 may for example be formed asp- and n-doped InP layers, respectively, see FIG. 5. The contact layer 109 has a larger footprint, so as to be contacted by off-centered ohmic contacts 113b, 116b (seen in FIG. 5), whereas inner contacts 114b, 115b are in electrical communication with the upper layer contact 107.

As seen in FIGS. 5 and 6, symmetric sets of ohmic contacts (metal-semiconductor contacts) can be formed by lower 113b, 114b, 115b, 116b metal contacts, which are joined by respective vertical metal vias 113a, 114a, 115a, 116a. The latter connect to top metal pads 113, 114, 115, 116, respectively. Incidentally, the top metal pads may also act as interconnect wirings. The ohmic contacts comprise p- and n-type contacts that respectively contact the p-doped layer 107 and the n-doped layer 109.

As further depicted in FIGS. 5 and 6, the lasing structure 107-109 can be embedded in a III-V wafer component 2. This can further be done in such a manner as to allow a common back-end of the line (BEOL) with other electronic components 30. For example, additional components 30 can be integrated within the same wafer component 2. To that aim, metal plugs, interconnects and vias 113, 113a, 114, 114a, 115, 115a, 116, 116a (FIG. 5) can be processed through various upper layers down to the lasing structure 107-109, and, if necessary, together with vias and metal plugs 35, e.g., as needed for co-integrated electronics 30 (see FIG. 6).

The depictions of FIGS. 1 and 2 explicitly show an electron blocking layer (EBL) 106, i.e., a layer (e.g., comprising III-V semiconductor materials) designed to block electrons, while being permissive to holes. In that respect, this EBL differs from a CBL as otherwise involved in the context of this invention, since a CBL is designed to block both electrons and holes, consistently with definitions used in the art. The EBL 106 is optional. It may be considered to form part of the active region, or not, while the effective refractive index of the RIM-CBLs can be matched to that of the optically active III-V stack 108, or to the effective index of the active region as a whole, this including the EBL 106.

Now, the active region 108 shall, typically, further comprise separate confinement heterostructures (SCHs, not shown). Thus, the present devices will likely be designed, so as for the effective index of the mode to match the effective refractive index of the III-V stack 108, rather than the effective index of the structure 106-108. In that case, the EBL (if present) would not be considered to form part of the active region. Yet, in variants, the EBL may be arranged between, e.g., a MQW structure (forming the core of the active region) and SCHs, in which case the EBL should be considered to form part of the active region. There, the effective index of the mode should rather match the effective index of the whole structure, i.e., including the III-V MQW, the EBL and the SCHs.

Same considerations apply to variants where the active region includes quantum dots (QDs), sandwiched into MQWs. In such cases too, the active region may further include SCHs and an EBL. Thus, most generally, the effective index of the RIM-CBLs can be matched to that of the sole optically active components (MQW, QDs, etc.) of the stack 108, or to the effective index of the active region as a whole, the latter possibly including an EBL and/or SCHs. We note, however, that the presence of SCHs and EBL will not substantially impact the effective index of the active region, in practice, such that the above distinction may not be significant.

In addition, the active region may possibly comprise a residual portion of a seed layer (not shown), which is initially used to grow the MQW stack 108. That is, this seed layer corresponds to the cap layer of the initial deposition (e.g., by metal-organic chemical vapor deposition), which is upside down after bonding and can then act as a seed layer for the contact layers 107, 109. The seed layer may for instance comprise InP or any other suitable III-V compound material.

A bonding layer 105 is typically needed, which extends at the interface between the two wafer components 1, 2, as illustrated in FIG. 5 (not shown in FIGS. 1-2). The bonding layer 105 may in fact result from two separately deposited layers. For completeness, the lasing structure 107-109, 121 is, together with the surrounding CBLs 121, 122, cladded with, e.g., an oxide layer 112, which may for example comprise $SiO_2$ or $Al_2O_3$, like layers 101, 103 in the lower wafer component 1.

As better seen in FIGS. 1 and 2, the CBLs 121, 122 extend parallel to the main plane of the active region 108, so as to separate the latter from the p-doped layer 107 and the n-doped layer 109. That is, the active region 108 is, together with surrounding CBLs 121, 122, sandwiched between contact layers 107, 109.

To that aim, the average thickness t of the RIM-CBLs 121 (as measured along z) shall preferably be essentially equal to, or within a threshold tolerance of, the average thickness t of the active region 108, so as to form a compact, planar structure 106-108-121. This equality is subject to a tolerance. For example, the relative difference (in absolute value) may be less than 20% or 10%, depending on the materials, geometries and processing techniques chosen. The average thickness t of the RIM-CBLs 121 may for example be between 100 nm and 500 nm, so as to make a shallow stack and, in turn, enable an easy integration of the electro-optical device. More preferably, this thickness is between 200 nm and 300 nm.

Similarly, the average thickness t of the one or more second CBLs 122 can be made essentially equal to, or within a threshold tolerance of, the average thickness of the CBLs 121 (and the active region 108). Note that the CBLs 121, 122 may all be epitaxially grown. In variants, the CBLs 121, 122 may result from an initial growth performed to grow layers 105-108 (or, in other variants, layers 105, 106 and 108). Subsequent oxidation or wet-etching steps will then allow a same thickness to be easily obtained. In further variants, one may rely on regrowth techniques to obtain the CBLs 121, 122. Still, even in that case, a same thickness t is desired to achieve a proper regrowth of layer 107.

At present, preferred materials for the various components of the electro-optical devices 11-14 are discussed. To start with, the cladding layers 101, 103, 112 typically comprise a same material, e.g., $SiO_2$, Sapphire (i.e., crystalline $Al_2O_3$) or amorphous $Al_2O_3$. Most typically yet, the cladding layers 101, 103, 112 comprise $SiO_2$.

Next, the III-V stack 108 may comprise $In_{1-x-y}Al_xGa_yAs$ ($0 \leq x \leq 1$, $0 \leq y \leq 1-x$). For example, a range of materials can thus be contemplated, including InAs, AlAs, InGaAs (e.g., for quantum dots lasers) and InAlGaAs. In particular, InAs quantum dots can be contemplated when using a GaAs substrate. In variants, the III-V stack 108 may comprise InGaAsP or InGaAsN. In general, the III-V stack 108 may comprise a MQW section sandwiched between other III-V materials (e.g. InP, or GaAs), preferably lattice matched to the MQW section to prevent oxidation, as needed to start the growth of the core III-V stacked layers. The III-V stack 108 may also comprise quantum dots sandwiched between quantum wells, as known per se.

Such a layer stack 108 is relatively easy to grow, e.g., by molecular beam epitaxy MBE or by metal-organic chemical vapor deposition. The semiconductor materials can be doped, if necessary, and preferably in conjunction with strain, e.g., to tune the bandgap.

The CBLs 121 preferably comprise InAlGaAs, though other III-V materials may be contemplated, such as InAlAs. On the other hand, the second CBL 122 preferably comprises InP, or one or more oxide, as mentioned earlier. Note that, even in variants where CBLs 122 comprise an oxide, such CBLs 122 still differ from a mere cladding, geometrically, inasmuch as a cladding usually refers to a material in which the structure 107, 108, 109 is, embedded, as a whole.

The effective refractive index of the III-V stack will typically be of 3.3-3.4, whereas the refractive index of Si is of about 3.5, for optical wavelengths of interest. Thus, the refractive index of layers 112, 122 need be lower, e.g., less than 3.25, to ensure a good optical confinement and coupling. For example, the refractive index of each the layers 112, 122 may be less than 2.5 (e.g. for a wavelength larger than 200 nm), so as to ensure a sufficient difference of effective refractive indices between, on the one hand, the layers 112, 122 and, on the other hand, the active optical materials of the stack 108 and the Si waveguide 102.

Examples of materials that may typically be involved in the present devices 11-14 are listed in FIG. 5.

In the embodiments of FIGS. 1, 2, 3, 5, and 6, the CBLs 121, 122 are formed as strips (i.e. as long, narrow pieces of materials), extending along axis x (see, e.g., FIG. 3), and located on opposite sides of the active region (e.g., a parallelepiped). Namely, each of the first and second CBLs comprise two strips, so as for the inner region 108 to be laterally nested within two strips 121, which are themselves nested, laterally within two strips 122, as best seen in FIG. 3.

However, in variants, the RIM-CBL and the lower-index CBL may, each, be formed as a single layer portion, as now described in reference to the device 12a of FIG. 4. Namely, the RIM-CBL 121a may be structured so as to partly or fully surround the active region 108a, laterally. As for instance shown in FIG. 4, the structure 108a-121a-122a may form a microdisk, wherein the CBL 121a and the active region 108a are, each, formed as a ring (annulus), when seen from above. However, the structure 108a-121a-122a is inverted, compared to the structure 108-121-122 of FIG. 2, inasmuch as the active region 108a now extends outside and around the RIM-CBL 121a. Still, in that case too, the CBL 121a extends perpendicularly to the stacking direction z of the gain material. The CBL 121a further extends laterally (in-plane) on opposite sides of the active region 108a, except that said opposite sides are now formed by (an infinite number of) opposite edges on the inner edge surface of the ring-shaped region 108.

The lower-index CBL 122a is further arranged in the center, surrounded by the first CBL 121a. Thus, the CBLs 121a, 122a are nested, laterally (in-plane), within the outer ring 108a. As further seen in FIG. 4, the second CBL 122a extends perpendicularly to the stacking direction z and laterally on opposite, inner "sides" of the ring-shaped CBL 121a.

Now, and despite the apparent ring structure, we note that the operation of the device shown in FIG. 4 differs from that of a ring laser. Rather, and as indicated by the circular arrow in FIG. 4, optical modes (also referred to as whispering gallery modes in that case) shall circulate within the active region 108a, i.e., around the inner CBL 121a, and couple into the waveguide core 102 at the level of an overlap between the outer gain region 108 and the waveguide core 102. No mirror is needed in the waveguide core 102 in that case. In such a structure, the p-contact layer (not shown) need be provided on top of the inner CBL 122a, so as not to cause absorption of the optical mode, while the n-contact layer can be arranged around and in-plane with the active region 108a.

In variants, the CBLs 121a, 122a may not be circular; they may instead have a polygonal, ring shape. In general, the CBLs 121, 122 (or 121a, 122a) may be provided as one or more layer portions. For example, each strips 121, 122 may be grown as two or more layer portions. In all cases, the shapes of the CBLs 121, 122 (or 121a, 122a) is at least partly determined by the in-plane geometry of the active region 108 (108a).

Next, according to another aspect, the invention can be embodied as a Si photonics chip 13, 14, comprising an electro-optical device 10 integrated therein. As in devices 11, 12 described earlier, the electro-optical device 10 comprises an active region (with a stack 108 of III-V semiconductor gain materials) and one or more CBLs 121, which extend laterally on opposite sides of the active region 108. This optical device 10 may for instance be configured as an edge-emitting, vertical current injection laser device, as mentioned earlier.

Consistently with the present approach, the effective refractive index $n_1$ of the CBLs 121 of the device 10 is matched to the index n of the active region, i.e., $n_1 = f \times n$, with $f \in [0.95; 1.05]$. Again, this factor should be as close as possible to 1, e.g., $f \in [0.98; 1.02]$ or, even, $f \in [0.99; 1.01]$.

As illustrated in FIGS. 5 and 6, the present Si photonics chips 13, 14 preferably comprise two wafer components 1, 2. The first wafer component 1 is a silicon on insulator (all) wafer. The latter comprises a Si substrate 100 and a buried oxide layer 101 on top of the Si substrate 100. In addition, the first component 1 is assumed to have been processed so as to exhibit a Si component 102, structured from an initial top Si layer of the SOI wafer. The component 102 is embedded in a cladding layer 103, which completes the wafer component 1.

The second wafer component 2 comprises the active region 108, the RIM-CBLs 121 and, if necessary, second CBLs 122. The second component 2 is bonded to the first component 1, so as for the III-V stack 108 to be opposite the Si component 102. Yet, the cladding layer 103 extends between the III-V stack 108 and the Si component 102. The chips 13, 14 are otherwise designed so as to allow optical radiation out-coupled from the stack 108 to be coupled into the Si component 102, in operation. The component 102 is typically structured as a Si waveguide core 102, which may comprise, e.g., Bragg mirrors configured so as to provide a radiation feedback for the laser.

As noted earlier, a shallow component 2 is desired, be it to ease integration thereof. For example, the average thickness of the stack of III-V semiconductor gain materials is preferably between 50 nm and 500 nm (and more preferably between 200 nm and 300 nm), as measured parallel to the stacking direction z. More compact and thus shallower structures may, in principle, be obtained by using planar CBL portions 121, 122, whose thicknesses are essentially equal, or within a threshold tolerance value, and match that of the active region 108.

As evoked earlier, the integrated electro-optical device 10 is preferably CMOS-fabricated, so as for its III-V stack 108 to be embedded in the back end of the line (BEOL) of the Si photonics chip 13, 14. As illustrated in FIG. 6, the device 10 may for example be co-integrated, in the BEOL of the Si photonics chip 14, with one or more other CMOS-fabricated components (e.g. integrated circuits 30). That is, the electro-optical device 10 may be embedded in the second wafer component 2 so as to allow a common BEOL with other electronic components 30 integrated therewith. Such circuits may for instance comprise transistors 30 configured for driving the electro-optical device 10.

Preferred methods of fabrication of the Si photonics chips of FIGS. 5 and 6 are now discussed. Several aspects of such methods have already been implicitly addressed in the description of the devices 11-14. Thus, the preferred fabrication methods are only briefly summarized in the following.

Two structured wafer components 1, 2 need be achieved. Possible fabrication methods may either comprise a complete fabrication of each of these components. In variants, they rely on already partially fabricated wafers 1, 2.

In all cases, a first wafer component 1 may initially be provided (i.e. a SOI wafer) or fabricated. This wafer 1 comprises a Si substrate 100 and a cladding layer 101 on top of the Si substrate 100. The top Si layer of the SOI wafer 1 is structured to obtain a Si component 102, as needed for optical coupling. In variants where no Si waveguide core 102 is needed, the top Si layer could simply be removed. The second oxide layer 103 is deposited on the buried oxide 101 of the SOI wafer 1, so as to form a dual cladding layer 101, 103 with the Si component 102 embedded therein.

A second component 2 is further needed, which comprises the III-V stack 108, as well as, e.g., an electron blocking layer 106 and a bottom contact layer 109. Such layers can, for instance, be deposited on a seed wafer (not shown) prior to wafer bonding the two components 1, 2. In variant, the second component may also comprise a top contact layer 107. The III-V stack as initially provided on the wafer 2 may be further structured at this point, so as to finely structure the stack 108. The CBLs 121, 122 can, e.g., be obtained by selective epitaxial overgrowth and/or thanks to additional oxidation or etching steps (i.e., layers 121, 122 are selectively grown together, while an oxidation or etching step results in differentiating layers 121 and 122 (in terms of material composition)). In variants, CBLs 121 and 122 can be achieved by two separate, selective epitaxial overgrowth steps. When relying on an overgrowth technique, the top contact layer 107 will be deposited in a separate selective epitaxial overgrowth step after layers 121 and 122 have been deposited. After these steps, additional structuring by, e.g., dry etching, makes it possible to shape and/or reveal the active stack, in order to remove already grown portions of the stack that should eventually not be part of the active region (growing such portions may be needed to improve the selective growth) and/or remove masks used during the selective growth. The stack is then cladded with cladding layer 112, e.g., by chemical-vapor deposition. Contact vias are opened and subsequently filled with metal by e-beam evaporation or sputtering. The sputtered metal is structured and subsequently annealed, so as to form ohmic contacts 113b, 114b, 115b and 116b.

The first wafer component 1 is typically flattened by chemical mechanical polishing (CMP) prior to bonding with the III-V wafer 2. Preferably, CMP is also performed prior to depositing the bonding layer 105. An additional capping layer (e.g., $Al_2O_3$) may be deposited on the III-V wafer 2, to obtain high bonding strength. CMP may further be performed after depositing each bonding layer on both sides, and before bonding.

The second wafer 2 may initially be provided on a substrate (e.g., InP), coated by an etch stop layer. Such layers can nevertheless be removed by wet etching, prior to bonding the wafer components 1, 2.

As seen above, various processes can be involved in the fabrication of the devices, which are nevertheless commonly used and known, individually, in the semiconductor industry.

The above embodiments have been succinctly described. They may include components or structures that are not necessarily shown in the accompanying drawings, for the sake of conciseness. For example, electrodes and contacts were not systematically depicted, for conciseness. As another example, some of the present electro-optical devices may be configured as a distributed Bragg reflector laser. To that aim, the optical waveguide core may be structured so as to comprise one or more, e.g., two, Bragg reflectors arranged in one or each of: an input portion and an output portion of the waveguide core. In variants, the electro-optical devices may be configured as a distributed feedback laser, thanks to an optical waveguide core structured so as to comprise one or more distributed feedback reflectors arranged in a middle portion of the waveguide core, i.e., between the tapers.

Some of the methods described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many variants other than those explicitly touched above can be contemplated. For example, materials other than those explicitly listed in respect of the stack 108, the contact layers 107, 109, or the cladding materials 101, 103, 112 can be contemplated.

What is claimed is:

1. A hybrid, vertical current injection electro-optical device, comprising:
    an active region with a stack of III-V semiconductor gain materials designed for optical amplification and having an effective refractive index n, wherein the gain materials of the stack are stacked along a stacking direction z perpendicular to a main plane of the stack; and
    one or more first current blocking layers extending perpendicularly to the stacking direction z and laterally on opposite sides of the active region, wherein the one or more first current blocking layers each have an effective refractive index $n_1$, where $n_1 = f \times n$, with $f \in [0.95; 1.05]$.

2. The hybrid, vertical current injection electro-optical device according to claim 1, wherein factor f is between 0.98 and 1.02.

3. The hybrid, vertical current injection electro-optical device according to claim 1, wherein
an average width w of the one or more first current blocking layers is between 1 μm and 7 μm, the average width w measured in the main plane, in a direction that is perpendicular to both an oscillation direction and the stacking direction z.

4. The hybrid, vertical current injection electro-optical device according to claim 3, wherein
the average width w is approximately equal to a width of the active region perpendicular to both the oscillation direction and the stacking direction z, the average width w being measured along the direction that is perpendicular to both the oscillation direction and the stacking direction z.

5. The hybrid, vertical current injection electro-optical device according to claim 3, wherein
an average thickness t of the one or more first current blocking layers, as measured parallel to the stacking direction z, is approximately equal to an average thickness T of the active region.

6. The hybrid, vertical current injection electro-optical device according to claim 5, wherein
the average thickness t of the one or more first current blocking layers is between 100 nm and 500 nm.

7. The hybrid, vertical current injection electro-optical device according to claim 1, wherein
the one or more first current blocking layers correspond to one or more second current blocking layers and the hybrid, vertical current injection electro-optical device further comprises one or more third current blocking layers, which extend perpendicularly to the stacking direction z and laterally on opposite sides of a structure formed by the one or more second current blocking layers and the active region, wherein the one or more third current blocking layers each have an effective refractive index $n_2$, which is smaller than each of the refractive index n of the active region and the refractive index $n_1$ of the one or more first second current blocking layers, whereby $n_2 = f_2 \times \text{Min}[n, n_1]$, with $f_2 < 0.99$.

8. The hybrid, vertical current injection electro-optical device according to claim 7, wherein $n_2 = f_2 \times \text{Min}[n, n_1]$, with $f_2 < 0.90$.

9. The hybrid, vertical current injection electro-optical device according to claim 7, wherein
the device further comprises one or more ohmic contacts arranged opposite to portions of the one or more third current blocking layers, wherein a contact layer covers each of: the one or more second current blocking layers; the one or more third current blocking layers; and the active region.

10. The hybrid, vertical current injection electro-optical device according to claim 7, wherein
an average width w of the one or more third current blocking layers is approximately equal to each of: an average width W of the one or more second current blocking layers; and a width of the active region perpendicular to both the oscillation direction and the stacking direction z, the average width W and the width of the active region perpendicular to both the oscillation direction and the stacking direction z each being measured along a same direction y in the main plane.

11. The hybrid, vertical current injection electro-optical device according to claim 7, wherein
an average thickness t of the one or more third current blocking layers is approximately equal to an average thickness th of the one or more second current blocking layers and to an average thickness T of the active region, as measured parallel to the stacking direction z.

12. The hybrid, vertical current injection electro-optical device according to claim 1, wherein
the hybrid, vertical current injection electro-optical device is configured as an edge-emitting, vertical current injection laser device.

13. The hybrid, vertical current injection electro-optical device according to claim 1, wherein
the stack of III-V semiconductor gain materials comprises one of: $\text{In}_{1-x-y}\text{Al}_x\text{Ga}_y\text{As}$, with $0 \le x \le 1$ and $0 \le y \le 1-x$; InGaAsP; and InGaAsN.

14. A silicon photonics chip, comprising an electro-optical device integrated therein, wherein the electro-optical device comprises:
an active region with a stack of III-V semiconductor gain materials designed for optical amplification and having an effective refractive index n, wherein the gain materials of the stack are stacked along a stacking direction z perpendicular to a main plane of the stack; and
one or more current blocking layers extending perpendicularly to the stacking direction z and laterally on opposite sides of the active region, wherein the one or more current blocking layers each have an effective refractive index $n_1$, where $n_1 = f \times n$, with $f \in [0.95; 1.05]$.

15. The silicon photonics chip according to claim 14, wherein the silicon photonics chip comprises:
a first wafer component, which is a silicon on insulator wafer processed so as to exhibit: a silicon substrate; a buried oxide layer on top of the silicon substrate; and a silicon component structured from an initial top silicon layer of the silicon on insulator wafer, wherein the silicon component is further embedded in a cladding layer; and
a second wafer component, comprising the active region and the one or more current blocking layers, wherein the second wafer component is bonded to the first wafer component, so as for:
the stack of III-V semiconductor gain materials to be opposite the silicon component, the cladding layer extending between the stack and the silicon component; and
optical radiation out-coupled from the stack to couple into the silicon component, in operation.

16. The silicon photonics chip according to claim 15, wherein
the electro-optical device is a CMOS-fabricated device, whose stack of III-V semiconductor gain materials is embedded in a back end of a line of the silicon photonics chip.

17. The silicon photonics chip according to claim 16, wherein
the electro-optical device is co-integrated, in the back end of the line of the silicon photonics chip, with one or more CMOS-fabricated integrated circuits.

18. The silicon photonics chip according to claim 17, wherein
the one or more CMOS-fabricated integrated circuits comprise one or more transistors configured for driving the electro-optical device.

19. The silicon photonics chip according to claim 14, wherein
an average thickness t of the stack of III-V semiconductor gain materials is between 50 nm and 500 nm, as measured parallel to the stacking direction z.

20. The silicon photonics chip according to claim 14, wherein
the electro-optical device is configured as an edge-emitting, vertical current injection laser device.

* * * * *